United States Patent [19]

Gumbinner

[11] Patent Number: 4,942,421

[45] Date of Patent: Jul. 17, 1990

[54] METHOD OF PREVENTING BENDING OF LITHOGRAPHIC PRINTING PLATES

[75] Inventor: Robert Gumbinner, Tarrytown, N.Y.

[73] Assignee: H. T. Products, Inc., Tarrytown, N.Y.

[21] Appl. No.: 382,888

[22] Filed: Jul. 19, 1989

[51] Int. Cl.$^5$ .............................................. G03D 3/08
[52] U.S. Cl. ........................................ 355/27; 355/77; 354/320; 15/77; 15/102; 430/302
[58] Field of Search ............... 354/317, 319, 320, 321, 354/322, 325; 15/77, 100, 102; 355/27, 77; 430/300, 302

[56] References Cited

U.S. PATENT DOCUMENTS

| | | | |
|---|---|---|---|
| 3,641,905 | 2/1972 | Adams | 354/317 |
| 4,119,991 | 10/1978 | Martino | 354/320 |
| 4,148,576 | 4/1979 | Martino | 354/320 |
| 4,383,751 | 5/1983 | Schornig et al. | 15/77 |
| 4,737,811 | 4/1988 | Schoernig et al. | 354/317 |

*Primary Examiner*—A. A. Mathews
*Attorney, Agent, or Firm*—David H. Semmes

[57] ABSTRACT

Processing of lithographic printing plates, particularly a method of preventing bending of the plates during processing.

Conventionally, the chemical processing of lithographic printing plates includes advancing the plates between pairs of rotating brushes. The trailing edge of such plates is bent upwardly or downwardly after passing through the pairs of brushes. The present method places the pairs of brushes at an oblique angle with respect to the axis of advancing such that the leading and trailing edges of the lithographic plate laterally incrementally contact the brushes. As a result, bending is eliminated.

7 Claims, 6 Drawing Sheets

METHOD OF PREVENTING BENDING OF LITHOGRAPHIC PRINTING PLATES

CROSS-REFERENCES TO RELATED INVENTIONS:

None

BACKGROUND OF THE INVENTION:

(1) Field of the Invention:

Processing of lithographic printing plates, particularly a method of preventing bending of lithographic printing plates during chemical processing, such as developing. A pair of rotating scrub brushes are placed at an oblique angle with respect to the axis of the advancing lithographic plate, such that the leading and trailing edges of the plate literally incrementally contact the brushes.

(2) Description of the Prior Art:

| ORANSKY, et al. | 3,480,432 |
| MILLER, et al. | 3,677,059 |
| SLINGSBY | 4,034,433 |
| HORNER | 4,081,815 |
| ALLEN | 4,101,315 |
| LEVEILLE | 4,334,758 |
| BUCKLER | 4,588,277 |

SUMMARY OF THE INVENTION:

Method of preventing bending of lithographic printing plates during chemical processing including exposing the printing plate, developing the exposed image by placing the exposed plate within a developing solution, then advancing the developed plate between a pair of rotating brushes mounted at an oblique angle with respect to the axis of said advancing, such that the leading and trailing edges of the lithographic plate laterally incrementally contact the brushes.

Figure 1:
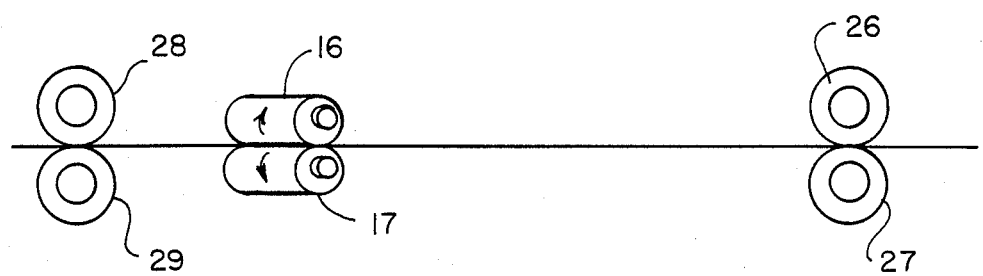
FIG. 1 is a schematic view of processing a printing plate 10 according to the present invention by advancing the plate through a pair of scrub brushes 16, 17 rotatably supported at an oblique angle with respect to the axis of advancing.

DESCRIPTION OF THE PREFERRED EMBODIMENTS:

In FIG. 1, lithographic printing plate 10 is illustrated schematically as advancing from right to left through Station A' comprising a pair of conventional rollers 26, 27 supported at a right angle to the axis of advancing, thence through Station B comprising a pair of rollers 16, 17 placed obliquely to the axis of advance and then through Station C comprising conventional rollers 28, 29 placed at a right angle to the axis of advance.

Figure 2:
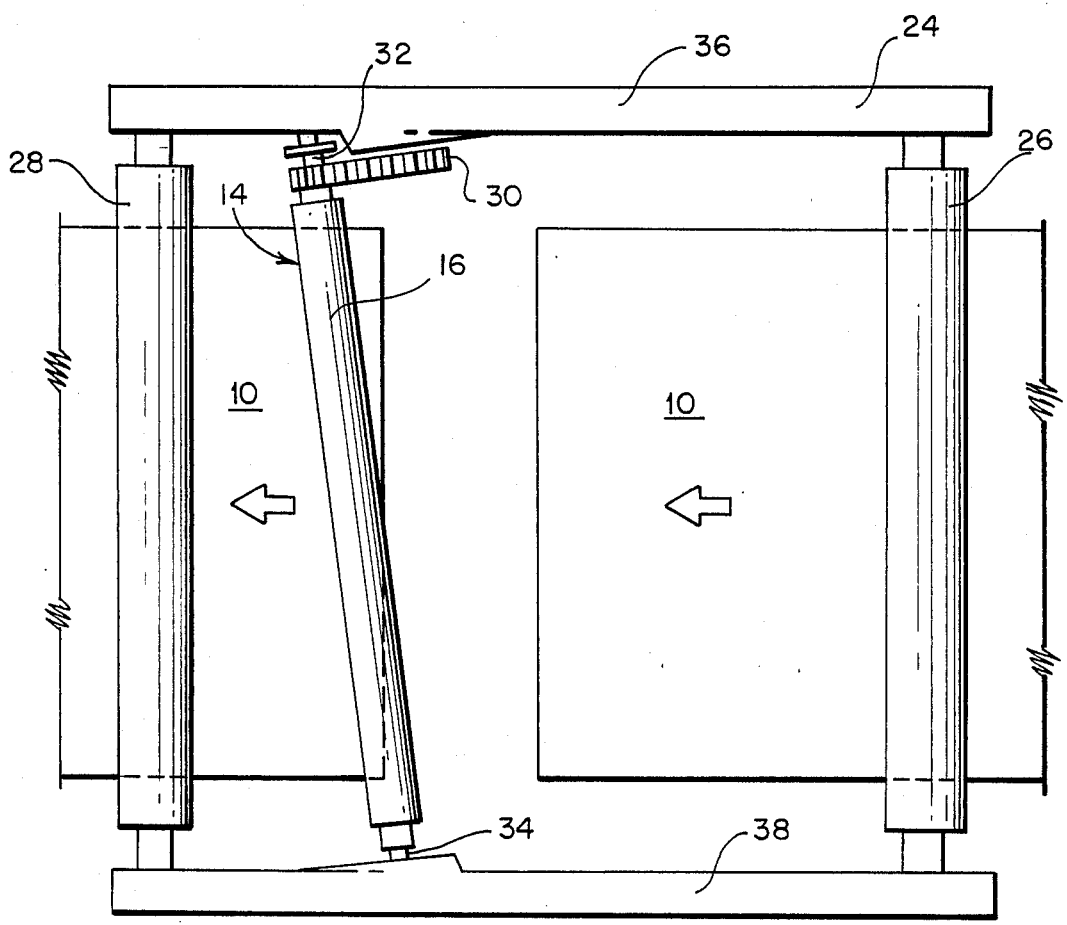
FIG. 2 is a top plan of the suggested installation of FIG. 1.

This arrangement is further illustrated in top plan in FIG. 2 wherein pairs of rollers 26, 27, 16, 17 and 28, 29 are mounted in frame 24 comprising right hand frame element 36 and left hand frame element 38. The pair of rollers 16, 17 may include shaft extensions 32, 34 mounted obliquely in contoured frame shoulders. A spur gear drive 30 may be positioned to engage shaft extension 32.

Figure 3:
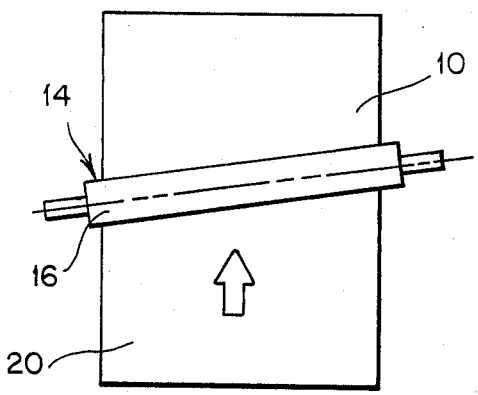
FIG. 3 is a top plan showing a lithographic printing plate half-way advanced through the obliquely angled rollers 16, 17.

In FIG. 3, conventional rectangular lithographic printing plate 10 is shown in its advance through the modified station 14 including rotatable roller brushes 16, 17 supported obliquely with respect to the axis of advance, as indicated by arrow.

Figure 4:
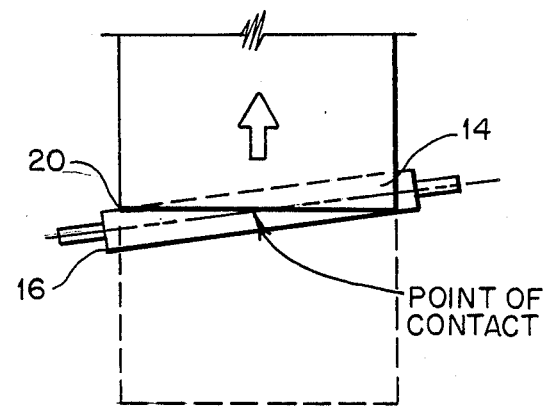
FIG. 4 is a top plan showing a lithographic printing plate at the point of departure from the obliquely angled rollers 16, 17.

FIG. 4, in a similar view, illustrates printing plate 10 as its trailing edge 20 incrementally contacts the pair of angle brushes 16, 17.

Figure 5:
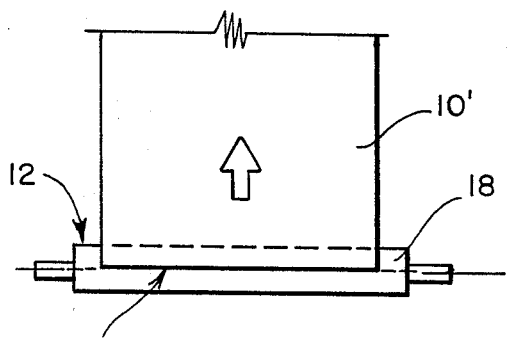
FIG. 5 is a top plan (partially fragmentary) showing a conventional scrubbing installation wherein the full trailing edge 20' of the printing plate 10' is in full contact across rollers 18, 19, mounted perpendicularly to the axis of advance.
Figure 6:
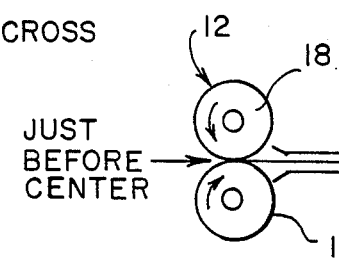
FIG. 6 is a side elevation of the conventional installation illustrated in FIG. 5 wherein trailing edge 20 is just approaching full contact between rollers 18, 19.
Figure 7:
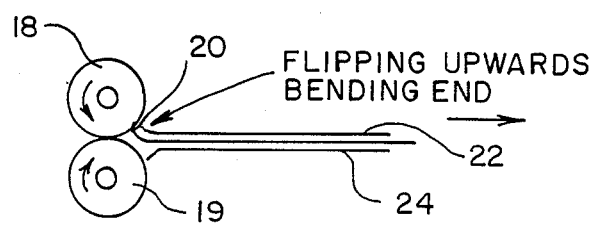
FIG. 7 is a side elevation of the conventional installation illustrated in FIGS. 5 and 6 wherein the trailing edge 20 has just passed full contact between rollers 18, 19 and is bent upwardly, notwithstanding top guide 22 and bottom guide 24.

In FIGS. 5, 6 and 7, printing plate 10' is illustrated as advancing through conventional brush installation 12 wherein rotatable brushes 18, 19 are positioned at a right angle with respect to the axis of advance.

As will be apparent in FIGS. 5 and 6, the plate trailing edge 20' assumes full contact across brushes 18, 19. As a consequence and as illustrated in FIGS. 6 and 7, trailing edge 20 flips upwardly or bends, as trailing edge 20 is advances through the brushes. Conventional guide plates 22, 24 are unable to straighten out or correct the trailing edge bent.

Figure 8:
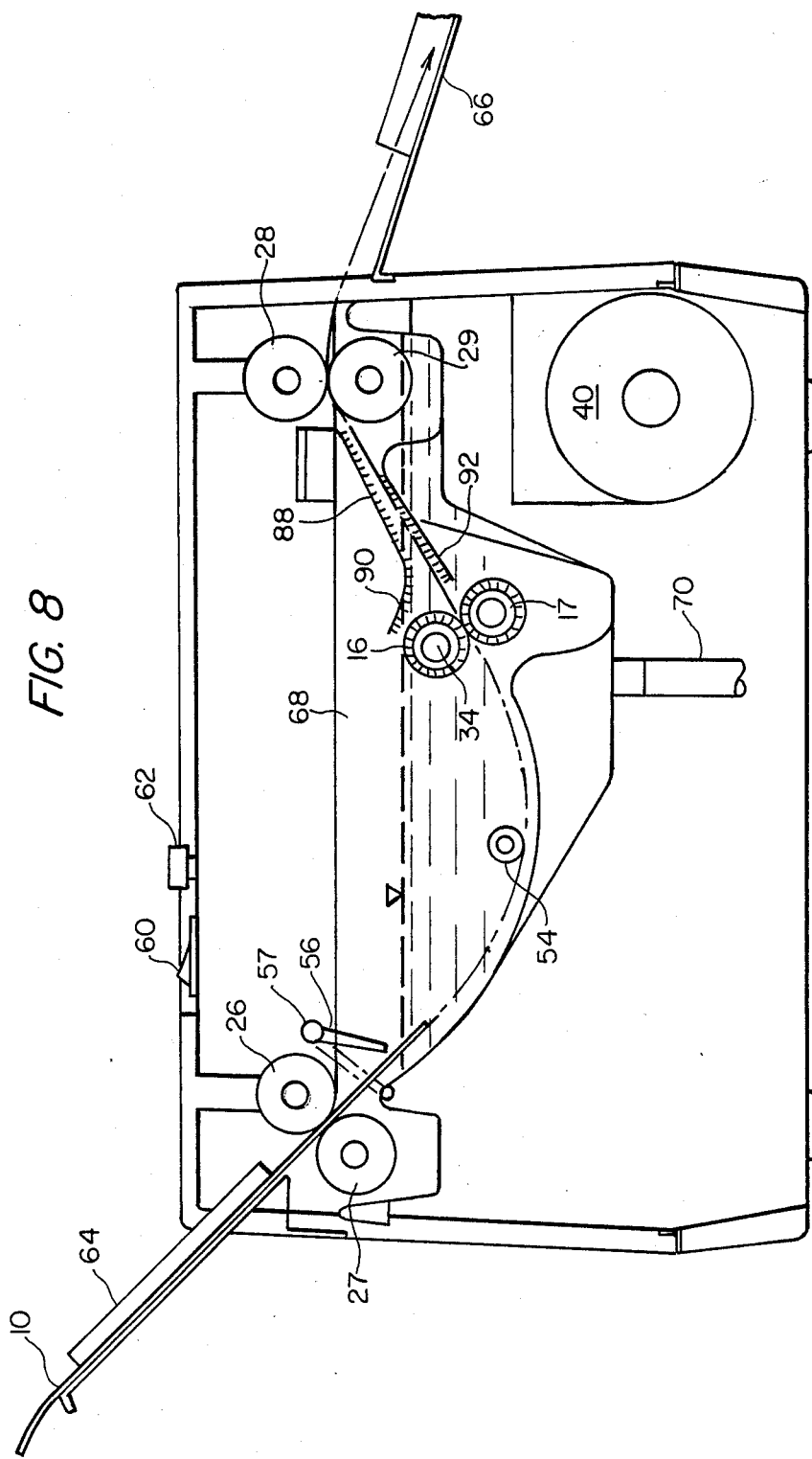
FIG. 8 is a schematic of a proposed installation including a reversible drive motor for the scrub brushes, which is activated by a reversing relay feeler contacting the advancing plate.
Figure 10:
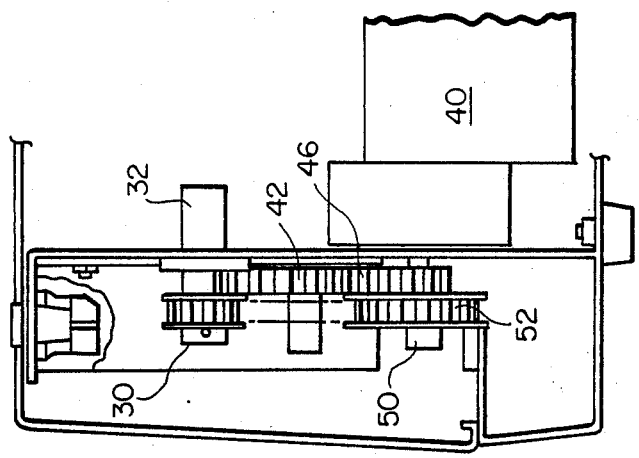
FIG. 10 is a fragmentary end elevation showing the gearing mechanism supported outside of the developing tank.

In FIG. 8, the proposed installation is illustrated as including developing tank 68 within which rotating scrub brushes 16 and 17 are rotatably supported and driven by variable speed reverse drive motor 40.

The device includes a feeding guide 64 and an exit guide 66, on/off switch 60 and speed control knob 62. A feeler relay 58 is supported adjacent feeding rollers 26 and 27 and, as contacted by the advancing plate 10, activates motor 40 to rotate rollers 16 and 17 so as to run with plate 10.

Velcro exit guide 88, including a top upwardly inclined portion 90 extending above roller 16 is positioned above advancing plate 10 and bottom exit guide 92 is positioned therebeneath.

Figure 9:
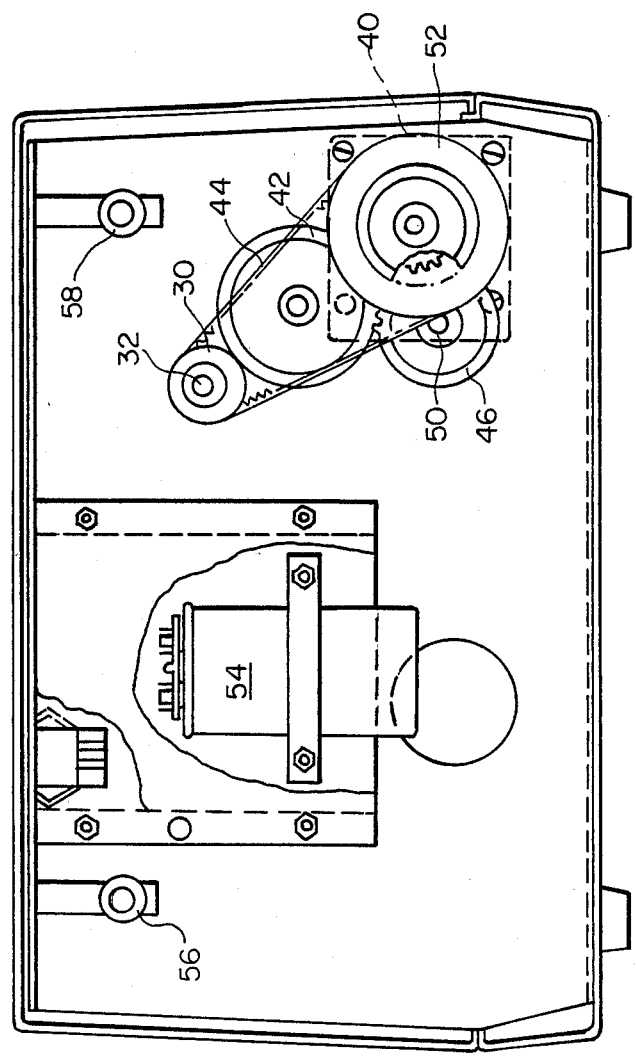
FIG. 9 is a side elevation, partially in phantom, showing the drive for the scrub brushes.

In FIG. 9 there is illustrated a drive mechanism for the scrub brushes 16 and 17, including drive motor 40, drive shaft 50, belt pulleys 52 and 30 upon which drive belt 44 is mounted. Also a sprocket drive is presented there engaging sprocket gears 45, 46, 42 and 30, the latter being mounted upon shaft 32.

Figure 12:
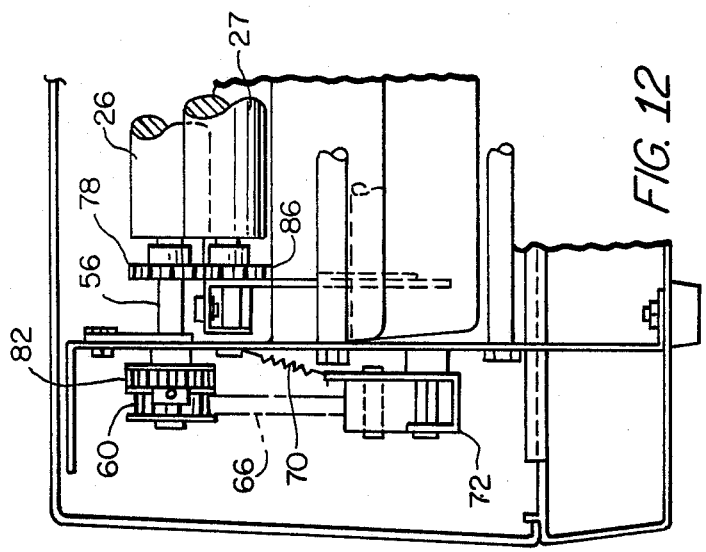
FIG. 12 is a fragmentary end elevation thereof showing the drive mechanism for the feeding and exit rollers positioned outside of the developing tank.
Figure 11:
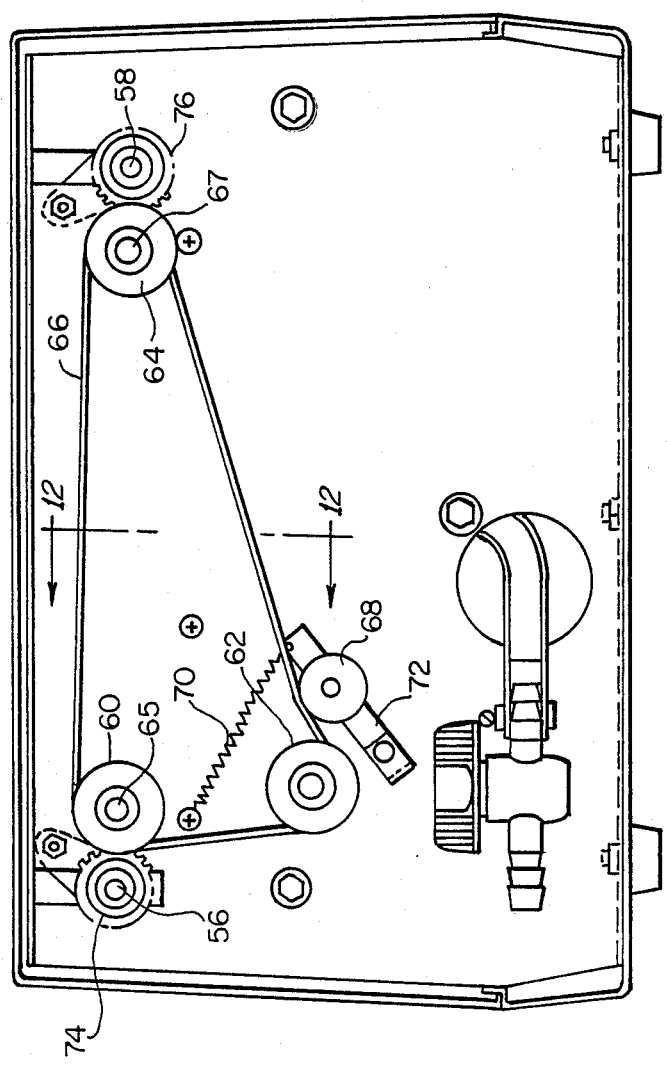
FIG. 11 is a schematic view of the drive mechanism for the feeding and exit rollers.
Figure 13:
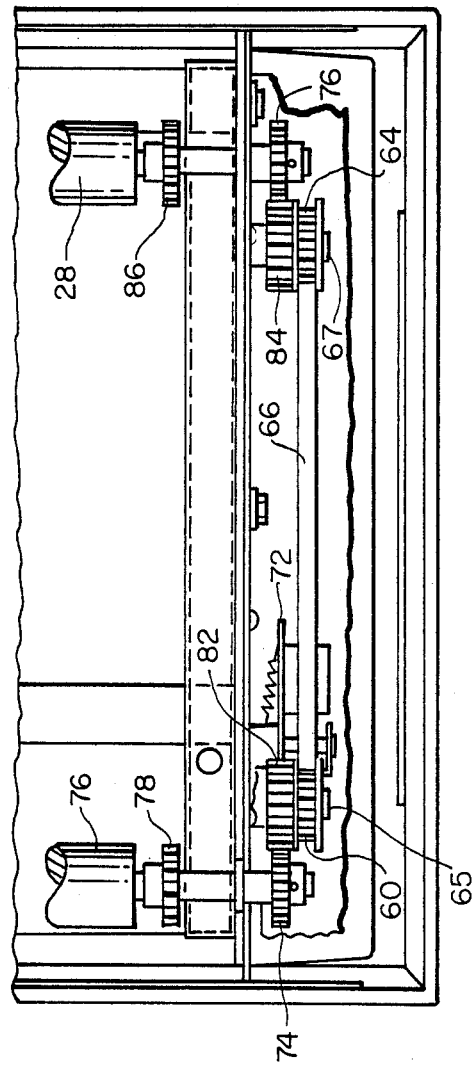
FIG. 13 is a fragmentary top plan thereof.

In FIGS. 11–13, a drive mechanism for feeding rollers 26, 27 and the exit rollers 28, 29 is illustrated as comprising variable speed forward drive motor 54, driving sprocket 62 upon which belt 66 engages pulleys 60, 64. A tensioning roller 68 engaging belt may be pivoted upon arm 72 and retained by tension spring 70. Pulleys 60 and 64 respectively engage sprockets 74, 76 mounted upon shafts 56, 58.

As illustrated in FIG. 12, drive rollers 26, 27 are connected by means of engaging sprocket gears 78, 86. Each pulley 60, 64 is mounted respectively upon shaft 65, 67 coaxially with cogs spur gears 82, 84 which engage the respective sprocket gears 74, 76.

Figure 14:
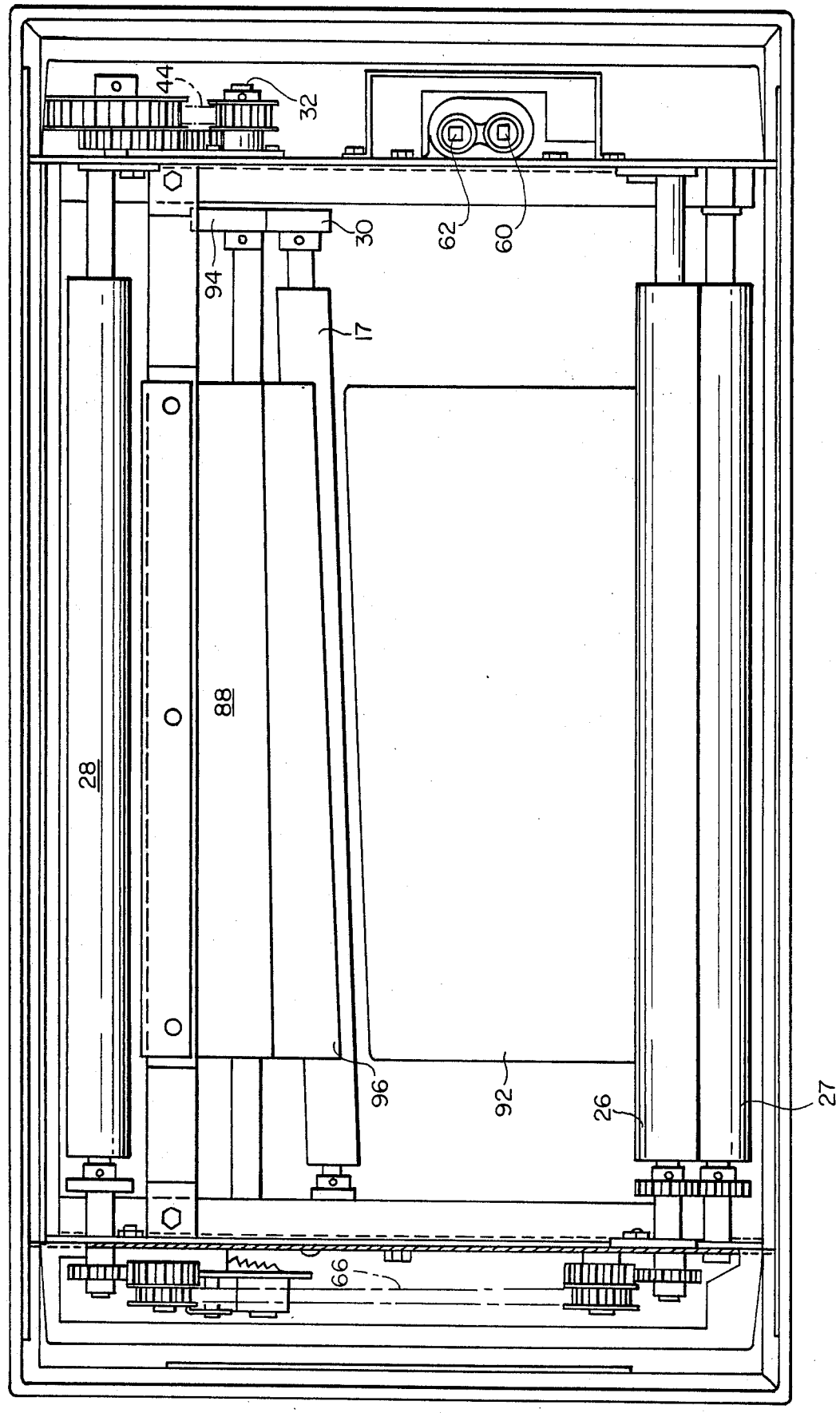
FIG. 14 is a top plan of the device, showing the velcro plate 88 extending over the scrub brush 16.

In FIG. 14, there is illustrated in top plan the entire assembly including velcro plate 88 with its upwardly inclined tip 90 extending over scrubbing brush 17 and plate 92 extending downwardly toward scrub brush 17.

EXAMPLE NO. 1:

As illustrated in FIGS. 5 through 7, two presensitized lithographic plates 10' of the subtractive type, 10" wide by 15" long and approximately 0.005 thick, were placed in a vacuum exposure frame and covered with a negative transparency which included line work, draft tones, and a "Stauffer Grey Scale". After the lid was closed, and a vacuum drawn, plates 10' were exposed to the ultraviolet light source for two minutes.

An examination of plates 10', after removal from the exposure frame, showed that the light-sensitive coating after development had been converted to what would be a solid "Step Six" on the "Grey Scale".

A negative plate developing solution, recommended by the manufacturer of plates 10', was put into two plate processors, one a standard rotating brush unit 12 and the other an improved rotating brush unit 14 having the angled brushes 16, 17 obliquely supported with respect to the axis of advance. One of the plates 10' was put in the standard unit 12, passed through and the unexposed coating removed. As plate 20 was removed from standard unit 12, it was noted that the trailing edge 20' was bent upwardly as illustrated in FIG. 7 and has to be bent in the opposite direction in order that plate 10' might be mounted upon a printing press. Upper plate guide 22 and lower plate guide 24 were unable to correct the trailing edge bend.

On the other hand, both the leading edge and the trailing edge 20 advanced through the processor 14 supporting the pair of angled brushes 16, 17 were flat and without bend. This plate 10 was mounted on the press without modification and printed without difficulty.

EXAMPLE 2:

In a second test, the processors were filled with an alkaline developing solution for positive-working lithographic plates. Such alkaline developing solutions have a pH higher than 11.5, such as five percent (5%) trisodium phosphate solution with a small amount (less than 0.5%) of sodium hydroxide.

Two aluminium lithographic plates 10, 11"×18" and 0.006" thick, which had been grained and coated with a positive-working coating, such as a polymeric ester of diazo oxide, plus a phenolic resins and indicator dyes, were exposed to ultraviolet light for five minutes through a film transparency including line work, half tones and at "Grey Scale", within a vacuum frame (not illustrated).

One of these aluminium lithographic plates 10 was then advanced through the standard unit 12 (illustrated in FIGS. 5 and 7) with rotatable brushes 18, 19 supported at right angles to the plate as illustrated in FIGS. 5, 6 and 7. The other plate 10 was advanced through the improved unit 14 (illustrated in FIGS. 3, 4 and 6), as supporting obliquely angled rotating brushes 18, 19 in order to remove the light-exposed coating.

As illustrated in FIG. 7, the trailing edge 20' of plate 10 advanced through standard unit 12 was flipped or bent upwardly. On the other hand, both the leading edge and trailing edge 20 of the plate advanced through the improved unit 14 were without bend. Both edge 20 of the plate 10 from the unit 14 with the pair of angled brushes 16 were flat.

As will be apparent, the suggested device may be used to remove light-sensitive coating from the non-image area of presensitized lithographic plates so that the coating is left only where the press will pick up ink from the inking rollers of the lithographic plate. Scrubbing brushes 16 and 17 remove the coating from the background or non-image area which will be hydrophilic and become wetted with the fountain solution, e.g. water, such that ink will not adhere in this non-image area.

After the processor developing tank has been filled with one gallon of the developing solution, and turned on, the printer, or pre-press operator places lithographic plate 10 (which has previously been exposed in a vacuum frame to ultraviolet light) upon entrance tray 64, plate 10 advances between the entrance rollers 26, 27. Approximately a minute later, plate 10 will exit through exit rollers 28, 29 onto exit tray 66.

In the present process, plate 10 is immersed in the developing solution and the loosened coating brushed off by the rotating scrub brushes 16, 17. Exit rollers 28, 29 then remove all the developing solution except a thin film.

The developing solutions are generally proprietary products of those companies that manufacture the presensitized plate, such as Enco's "AX-2", 3-M Corp.'s "Viking" developer, and Polychrome's "Nova AQ955".

In the case of most negative-working plates, where the image area is photopolymerized, the developer generally consists of 60% to 75% water, 10% to 20% of detergents such as sodium salts of imidazalone, xylene and other sulfonates, citrates, sulfates and phosphates, and 2% to 10% of alcohol, such as N-propylalcohol and benzyl alcohol. If Eastman Kodak plates are used, the developer is essentially gamma butyrolactone.

If the plate is positive working, that is the ultraviolet light decomposes the non-image area, as in the case of the "Lydel" type plate sold by City Litho, an alkaline solution is used such as 10% trisodium phosphate or/and 0.2 to 2.0% sodium hydroxide.

Each developer manufacturer has its own developer solution formula, so as to optimize the effectiveness of removal of the specific coating and to maximize the length of time the developer solution can remain in use within the processor and still be effective.

I claim:

1. Method of preventing bending of lithographic printing plates during processing comprising:
   (a) exposing the printing plate;
   (b) developing an exposed image by placing the exposed plate within a developing solution, then
   (c) advancing the developed plate between a pair of rotating brushes mounted at an oblique angle with respect to the axis of said advancing, such that the trailing edge of said plate laterally incrementally contacts said brushes.

2. Method of preventing bending of lithographic printing plates during processing as in claim 1, wherein both the leading edge and the trailing edge of said advancing plate laterally incrementally contact said brushes.

3. Method of preventing bending of lithographic printing plates during processing as in claim 1, wherein said plate is of the presensitized subtractive type.

4. Method of preventing bending of lithographic printing plates during processing as in claim 2, wherein the plate is aluminum grained and coated with a positive working coating plus a phenolic resin and indicator dyes.

5. Method of preventing bending of lithographic printing plates during processing as in claim 4, wherein the positive working coating is a polymeric ester of diazo oxide.

6. Method of preventing bending of lithographic printing plates during processing as in claim 2, wherein the oblique angle of said rotating brushes is a 3–25° removed from a perpendicular to the axis of said advancing.

7. Method of preventing bending of lithographic printing plates during processing as in claim 2, wherein said printing plates are aluminum.

* * * * *